United States Patent
Kim et al.

(10) Patent No.: US 8,222,960 B2
(45) Date of Patent: Jul. 17, 2012

(54) RF POWER AMPLIFIER

(75) Inventors: Youn Suk Kim, Gyunggi-do (KR); Dae Seok Jang, Gyunggi-do (KR); Hyo Kun Bae, Seoul (KR); Seong Geun Kim, Gyunggi-do (KR); Young Jean Song, Gyunggi-do (KR); Ju Young Park, Gangwon-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/006,989

(22) Filed: Jan. 14, 2011

(65) Prior Publication Data

US 2012/0062324 A1    Mar. 15, 2012

(30) Foreign Application Priority Data

Sep. 15, 2010 (KR) .................. 10-2010-0090621

(51) Int. Cl.
*H02H 7/20* (2006.01)
(52) U.S. Cl. ..................... 330/298; 330/207 P
(58) Field of Classification Search ............ 330/298, 330/207 P, 277
See application file for complete search history.

(56) References Cited

U.S. PATENT DOCUMENTS

| | | | |
|---|---|---|---|
| 5,422,522 A * | 6/1995 | Rotay | 327/512 |
| 5,726,606 A * | 3/1998 | Marland | 330/302 |
| 6,690,237 B2 * | 2/2004 | Miyazawa | 330/285 |
| 6,731,171 B2 * | 5/2004 | Yamashita | 330/285 |
| 7,936,218 B1 * | 5/2011 | Lautzenhiser et al. | 330/295 |

FOREIGN PATENT DOCUMENTS

| | | |
|---|---|---|
| KR | 19980035337 A | 8/1998 |
| KR | 1020050105583 | 11/2005 |
| KR | 1020080045244 A | 5/2008 |
| WO | 2007035777 A2 | 3/2007 |

OTHER PUBLICATIONS

Korean Office Action 1020100090621 issued Jul. 29, 2011.

* cited by examiner

*Primary Examiner* — Henry Choe
(74) *Attorney, Agent, or Firm* — Lowe, Hauptman, Ham & Berner, LLP

(57) ABSTRACT

An RF power amplifier includes an RF choke coil, a power amplification circuit unit, and an electrostatic discharge (ESD) protection unit. The RF choke coil is connected to a voltage terminal through which an operating voltage is applied. The RF choke coil supplies the operating voltage and interrupts an RF signal. The power amplification circuit unit is supplied with the operating voltage through the RF choke coil. The power amplification circuit unit amplifies an input signal inputted through an input terminal and outputs the amplified input signal through an output terminal. The ESD protection unit is connected between a first connection node and a ground. The ESD protection unit bypasses an ESD voltage from the first connection node to the ground, the first connection node being a node between the voltage terminal and the RF choke coil.

6 Claims, 2 Drawing Sheets

RF POWER AMPLIFIER

CROSS-REFERENCE TO RELATED APPLICATIONS

This application claims the priority of Korean Patent Application No. 10-2010-0090621 filed on Sep. 15, 2010, in the Korean Intellectual Property Office, the disclosure of which is incorporated herein by reference.

BACKGROUND OF THE INVENTION

1. Field of the Invention

The present invention relates to an RF power amplifier which is applicable to a portable terminal, such as a portable phone or a portable communication device, and more particularly, to an RF power amplifier which can perform an electrostatic discharge (ESD) protection function, without signal distortion, and can be implemented inexpensively by reducing the number of diodes for ESD protection.

2. Description of the Related Art

In general, a portable terminal, such as a portable phone or a portable communication device, is designed to have a large number of integrated circuits (ICs), including an RF power amplifier, in order to increase the power of a transmit signal.

In order for a more reliable operation of a portable terminal, ESD protection circuits are necessarily provided in all IC output terminals. In particular, as compared to other circuits, a voltage higher than a power supply voltage is generated at an output terminal of an RF power amplifier. Hence, it is necessary to further increase the size of an ESD protection circuit.

However, when an ESD circuit is installed in an output terminal of a conventional RF power amplifier, a peak voltage of an output signal is significantly high due to RF power amplification. Therefore, in order to prevent the ESD protection circuit from operating at the peak value of the output signal, a large number of diodes connected in series are used inside the ESD protection circuit, thereby increasing the size thereof. The manufacturing costs of the ESD protection circuit are additionally increased.

SUMMARY OF THE INVENTION

An aspect of the present invention provides an RE power amplifier which can perform an ESD protection function, without signal distortion, and can be implemented inexpensively by reducing the number of diodes for ESD protection.

According to an aspect of the present invention, there is provided an RF power amplifier including: an RF choke coil, connected to a voltage terminal through which an operating voltage is applied, supplying the operating voltage and interrupting an RF signal; a power amplification circuit unit, supplied with the operating voltage through the RF choke coil, amplifying an input signal inputted through an input terminal and outputting the amplified input signal through an output terminal; and an electrostatic discharge (ESD) protection unit, connected between a first connection node and a ground, bypassing an ESD voltage from the first connection node to the ground, the first connection node being a node between the voltage terminal and the RF choke coil.

According to another aspect of the present invention, there is provided an RE power amplifier including: an RF choke coil, connected to a voltage terminal through which an operating voltage is applied, supplying the operating voltage and interrupting an RE signal; a capacitor for an AC ground, provided between a first connection node and a ground, the first connection node being a node between the voltage terminal and the RE choke coil; a power amplification circuit unit, supplied with the operating voltage through the RE choke coil, amplifying an input signal inputted through an input terminal and outputting the amplified input signal through an output terminal; and an ESD protection unit, connected between the first connection node and the ground, bypassing an ESD voltage from the first connection node to the ground.

The ESD protection unit may include: a first diode circuit unit provided between the first connection node and the ground and turned on by a positive ESD voltage; and a second diode circuit unit provided between the first connection node and the ground and turned on by a negative ESD voltage.

The first diode circuit unit may include a plurality of diodes which make a positive set voltage for ESD protection have a level between the operating voltage and a peak voltage of the RF signal outputted from the power amplification circuit unit.

The second diode circuit unit may include a plurality of diodes which make a negative set voltage for ESD protection have a level between an inverted operating voltage and an inverted peak voltage of the RF signal outputted from the power amplification circuit unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
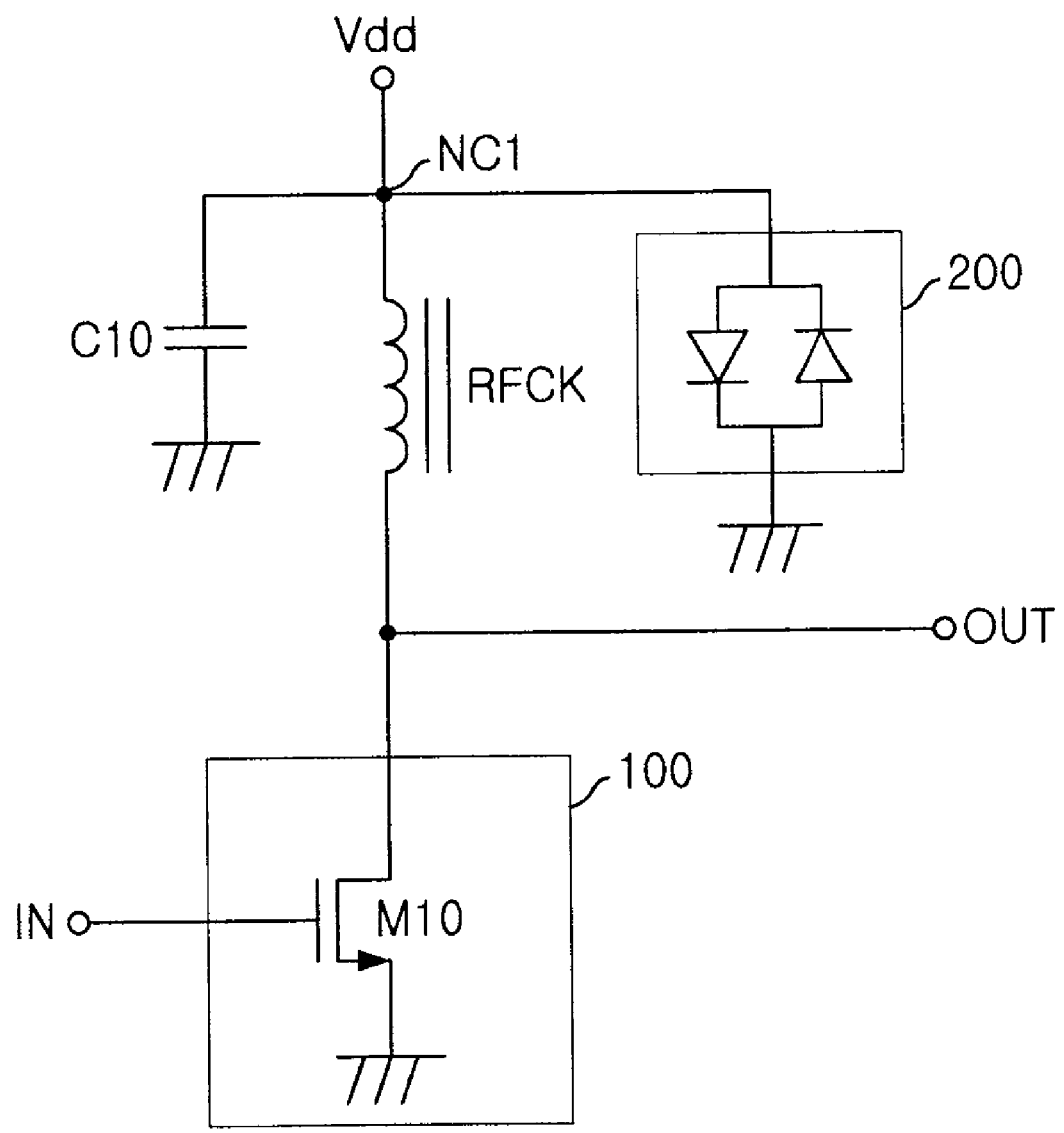
FIG. 1 is a circuit block diagram of an RF power amplifier according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

FIG. 1 is a circuit block diagram of an RF power amplifier according to an embodiment of the present invention.

Referring to FIG. 1, the RF power amplifier according to the embodiment of the present invention may include an RF choke coil RFCK, a power amplification circuit unit 100, and an ESD protection unit 200. The RF choke coil RFCK is connected to a voltage terminal through which an operating voltage Vdd is applied. The RF choke coil RFCK supplies the operating voltage Vdd and interrupts an RF signal. The power amplification circuit unit 100 is supplied with the operating voltage Vdd through the RF choke coil RFCK. The power amplification circuit unit 100 amplifies an input signal inputted through an input terminal IN, and outputs the amplified input signal through an output terminal OUT. The ESD protection unit 200 is connected between a first connection node NC1 and a ground. The first connection node NC1 is a node between the voltage terminal and the RF choke coil RFCK. The ESD protection unit 200 bypasses an ESD voltage from the first connection node NC1 to the ground.

Figure 2:
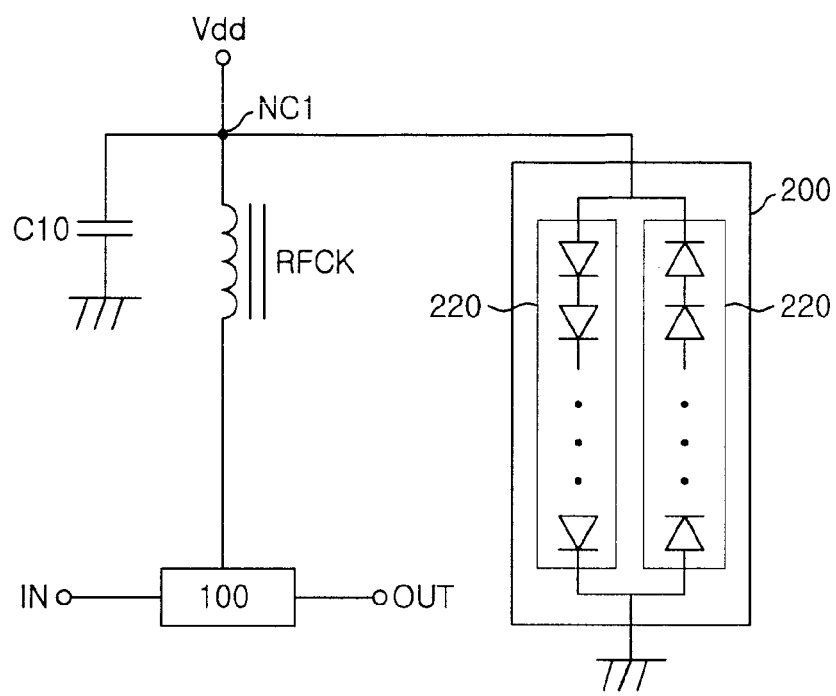
FIG. 2 is a configuration diagram of an ESD protection unit according to an embodiment of the present invention.

FIG. 2 is a configuration diagram of the ESD protection unit according to an embodiment of the present invention.

Referring to FIG. 2, the ESD protection unit 200 may include a first diode circuit unit 210 and a second diode circuit unit 220. The first diode circuit unit 210 is provided between the first connection node NC1 and the ground and is turned on by a negative ESD voltage.

The first diode circuit unit 210 may include a plurality of diodes which make a positive set voltage for ESD protection have a level between the operating voltage Vdd and a peak voltage $V_{peak}$ of the RF signal outputted from the power amplification circuit unit 100.

The second diode circuit unit 220 may include a plurality of diodes which make a negative set voltage for ESD protection have a level between an inverted operating voltage −Vdd and an inverted peak voltage $-V_{peak}$ of the RF signal outputted from the power amplification circuit unit 100.

Figure 3:
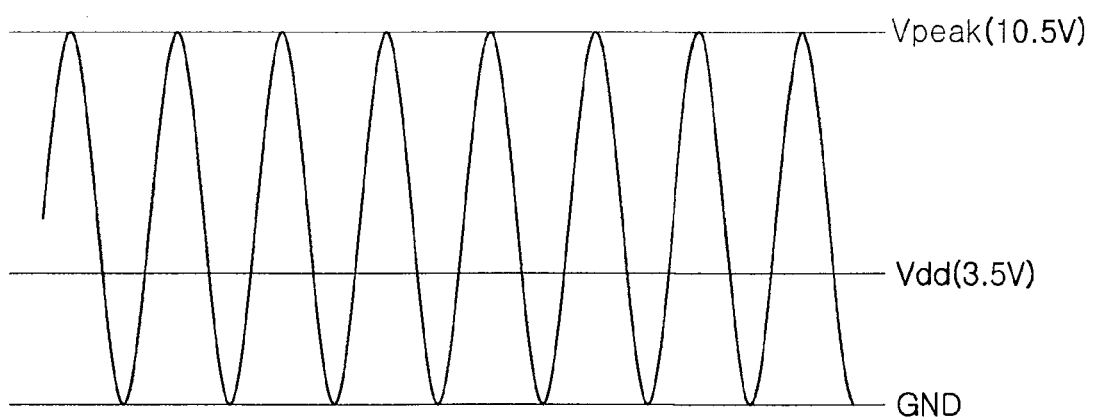
FIG. 3 is a voltage waveform diagram explaining an appropriate number of diodes included in the ESD protection unit according to the present invention.

FIG. 3 is a voltage waveform diagram explaining an appropriate number of the diodes included in the ESD protection unit 200 according to the embodiment of the present invention.

In FIG. 3, it is assumed that the operating voltage Vdd is 3.5 V, the peak voltage $V_{peak}$ of the RF signal outputted from the power amplification circuit unit 100 is 10.5 V, and a turn-on voltage of the single diode included in the ESD protection unit 200 is 0.5 V. When the ESD unit is connected to the output terminal OUT, at least twenty-two diodes are needed in order to prevent the ESD protection unit 200 from operating at the peak voltage $V_{peak}$ of 10.5 V.

On the other hand, when the ESD unit is connected to the first connection node NC1, the RF signal having the peak voltage $V_{peak}$ of 10.5 V is interrupted by the RF choke coil RFCK because it is a high-frequency component signal. Thus, the RF signal is not introduced into the first connection node NC1, and only an ESD voltage having a low frequency component is introduced into the first connection node NC1. Therefore, the ESD voltage is bypassed through the ESD protection unit 200 connected to the first connection node NC1, whereby the internal circuit can be protected from the ESD voltage.

Hereinafter, the operation and effect of the present invention will be described with reference to the accompanying drawings.

The RF power amplifier according to the embodiment of the present invention will be described below with reference to FIGS. 1 through 3. First, the power amplification circuit unit 100 illustrated in FIG. 1 is supplied with the operating voltage Vdd through the RF choke coil RFCK. The power amplification circuit unit 100 amplifies the input signal inputted through the input terminal IN, and outputs the amplified input signal through the output terminal OUT.

The ESD protection unit 200 illustrated in FIG. 1 is connected between the first connection node NCI and the ground, and bypasses the ESD voltage from the first connection node NC1 to the ground. The first connection node NC1 is the node between the voltage terminal and the RF choke coil RFCK.

That is, since the ESD voltage introduced through the output terminal OUT has a low frequency and a high voltage, the ESD voltage may be introduced into the first connection node NC1 through the RF choke coil RFCK. Therefore, the ESD voltage can be interrupted by the ESD protection unit 200 connected to the first connection node NC1.

The ESD protection unit 200 will be described below in detail, with reference to FIG. 2.

In FIG. 2, the ESD protection unit 200 includes the first diode circuit unit 210 configured to be turned on by the positive ESD voltage, and the second diode circuit unit 220 configured to be turned on by the negative ESD voltage.

First, the first diode circuit unit 210 is provided between the first connection node NC1 and the ground and is turned on by the positive ESD voltage.

That is, the first diode circuit unit 210 may include the plurality of diodes which make the positive set voltage for ESD protection have a level between the operating voltage Vdd and the peak voltage $V_{peak}$ of the RF signal outputted from the power amplification circuit unit 100.

Next, the second diode circuit unit 220 is provided between the first connection node NC1 and the ground and is turned on by the negative ESD voltage.

That is, the second diode circuit unit 220 may include the plurality of diodes which make the negative set voltage for ESD protection have a level between the inverted operating voltage −Vdd and the inverted peak voltage $-V_{peak}$ of the RF signal outputted from the power amplification circuit unit 100.

The appropriate number of diodes to be included in the ESD protection unit 200 according to the embodiment of the present invention will be described below with reference to FIG. 3.

In FIG. 3, it is assumed that the operating voltage Vdd is 3.5 V, the peak voltage $V_{peak}$ of the RF signal outputted from the power amplification circuit unit 100 is 10.5 V, and the turn-on voltage of the single diode included in the ESD protection unit 200 is 0.5 V. When the ESD unit is connected to the output terminal OUT, at least twenty-two diodes are needed in order to prevent the ESD protection unit 200 from operating at the peak voltage $V_{peak}$ of 10.5 V.

On the other hand, when the ESD unit is connected to the first connection node NC1, the RF signal having the peak voltage $V_{peak}$ of 10.5 V is interrupted by the RF choke coil RFCK because it is a high-frequency component signal. Thus, the RF signal is not introduced into the first connection node NC1, and only the ESD voltage having a low frequency component is introduced into the first connection node NC1. Therefore, the ESD voltage is bypassed through the ESD protection unit 200 connected to the first connection node NC1, whereby the internal circuit can be protected from the ESD voltage.

As described above, the RF power amplifier is applicable to the portable terminal can be implemented with a smaller number of diodes for ESD protection by changing the connection position of the ESD protection unit, thereby reducing the size and costs thereof.

As set forth above, according to exemplary embodiments of the invention, since the number of diodes for ESD protection is reduced, the RF power amplifier can perform the ESD protection, without signal distortion, and can be implemented inexpensively.

While the present invention has been shown and described in connection with the exemplary embodiments, it will be apparent to those skilled in the art that modifications and variations can be made without departing from the spirit and scope of the invention as defined by the appended claims.

What is claimed is:

1. An RF power amplifier, comprising:
   an RF choke coil connected to a voltage terminal through which an operating voltage is applied, the RF choke coil being configured to supply the operating voltage and interrupt an RF signal;

a power amplification circuit unit configured to receive the operating voltage through the RF choke coil, amplify an input signal inputted through an input terminal, and output an amplified input signal through an output terminal; and an electrostatic discharge (ESD) protection unit connected between a first connection node and a ground, and configured to bypass an ESD voltage from the first connection node to the ground, the first connection node being a node between the voltage terminal and the RF choke coil, wherein the ESD protection unit comprises:

a first diode circuit unit provided between the first connection node and the ground and configured to be turned on by a positive ESD voltage; and a second diode circuit unit provided between the first connection node and the ground and configured to be turned on by a negative ESD voltage.

2. The RF power amplifier of claim 1, wherein the first diode circuit unit comprises a plurality of diodes which define a positive set voltage for ESD protection, the positive set voltage having a level between the operating voltage and a peak voltage of the RF signal outputted from the power amplification circuit unit.

3. The RF power amplifier of claim 2, wherein the second diode circuit unit comprises a plurality of diodes which define a negative set voltage for ESD protection, the negative set voltage having a level between an inverted operating voltage and an inverted peak voltage of the RF signal outputted from the power amplification circuit unit.

4. An RF power amplifier, comprising:

an RF choke coil connected to a voltage terminal through which an operating voltage is applied, the RF choke coil being configured to supply the operating voltage and interrupt an RF signal;

a capacitor for an AC ground, provided between a first connection node and a ground, the first connection node being a node between the voltage terminal and the RF choke coil;

a power amplification circuit unit configured to receive the operating voltage through the RF choke coil, amplify an input signal inputted through an input terminal, and output an amplified input signal through an output terminal; and an ESD protection unit connected between the first connection node and the ground, the ESD protection unit configured to bypass an ESD voltage from the first connection node to the ground, wherein the ESD protection unit comprises:

a first diode circuit unit provided between the first connection node and the ground and configured to be turned on by a positive ESD voltage; and a second diode circuit unit provided between the first connection node and the ground and configured to be turned on by a negative ESD voltage.

5. The RF power amplifier of claim 4, wherein the first diode circuit unit comprises a plurality of diodes which define a positive set voltage for ESD protection, the positive set voltage having a level between the operating voltage and a peak voltage of the RF signal outputted from the power amplification circuit unit.

6. The RF power amplifier of claim 5, wherein the second diode circuit unit comprises a plurality of diodes which define a negative set voltage for ESD protection, the negative set voltage having a level between an inverted operating voltage and an inverted peak voltage of the RF signal outputted from the power amplification circuit unit.

* * * * *